(12) United States Patent
Johnson

(10) Patent No.: US 7,098,742 B2
(45) Date of Patent: Aug. 29, 2006

(54) DIFFERENTIAL/SINGLE-ENDED INPUT STAGE

(75) Inventor: Richard A. Johnson, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/836,744

(22) Filed: Apr. 30, 2004

(65) Prior Publication Data

US 2005/0242886 A1 Nov. 3, 2005

(51) Int. Cl.
*H03F 3/04* (2006.01)

(52) U.S. Cl. .......................................... 330/301; 330/51

(58) Field of Classification Search ............... 330/301, 330/252, 253, 277, 278, 51, 261, 129; 331/185, 331/117 FE; 327/387, 55, 221, 222, 228, 327/229

See application file for complete search history.

(56) References Cited

U.S. PATENT DOCUMENTS

| | | | | | |
|---|---|---|---|---|---|
| 4,780,625 | A | * | 10/1988 | Zobel | ........................... 327/53 |
| 5,258,951 | A | * | 11/1993 | Yu et al. | ................ 365/189.05 |
| 5,357,051 | A | | 10/1994 | Hwang | ........................ 174/33 |
| 6,265,944 | B1 | * | 7/2001 | Conta et al. | ................. 330/302 |
| 6,433,272 | B1 | | 8/2002 | Buhler et al. | ................. 174/27 |
| 6,570,427 | B1 | * | 5/2003 | Prentice | ..................... 327/287 |
| 6,624,699 | B1 | * | 9/2003 | Yin et al. | .................... 330/260 |
| 6,664,851 | B1 | * | 12/2003 | Pihlstrom et al. | ............. 330/51 |
| 6,683,472 | B1 | * | 1/2004 | Best et al. | ..................... 326/30 |
| 6,683,484 | B1 | * | 1/2004 | Kueng et al. | ................ 327/307 |
| 6,822,817 | B1 | * | 11/2004 | Chung et al. | .................. 360/46 |
| 6,867,658 | B1 | * | 3/2005 | Sibrai et al. | ................. 331/185 |
| 2004/0000924 | A1 | * | 1/2004 | Best et al. | ..................... 326/30 |
| 2004/0232993 | A1 | * | 11/2004 | Yeh | ........................... 330/295 |
| 2005/0162221 | A1 | * | 7/2005 | Barnett et al. | .............. 327/563 |
| 2005/0225419 | A1 | | 10/2005 | Johnson | ....................... 336/200 |
| 2005/0285629 | A1 | * | 12/2005 | Hein et al. | ................... 326/115 |

FOREIGN PATENT DOCUMENTS

DE 27 38 129 A1 3/1979

OTHER PUBLICATIONS

PCT/US2005/009752 International Search Report with Written Opinion of the International Searching Authority Mailed Oct. 21, 2005.

* cited by examiner

*Primary Examiner*—Linh V. Nguyen
(74) *Attorney, Agent, or Firm*—Trop, Pruner & Hu, P.C.

(57) ABSTRACT

An input stage for an integrated circuit device provides constant gain in selectable modes of either differential or single-ended operation. In one embodiment, transconductance devices are arranged so that the input impedance of the input stage matches the signal source impedance, regardless whether the input stage is selected to operate in a differential mode or in a single-ended mode. In accordance with an alternative embodiment, constant-gain and constant-impedance conditions are maintained in a configuration that comprises and input signal attenuator. In one application, the input stage may serve as a low-noise amplifier (LNA) for an integrated transceiver.

45 Claims, 5 Drawing Sheets

DIFFERENTIAL/SINGLE-ENDED INPUT STAGE

FIELD OF THE INVENTION

The invention relates generally to the design of integrated circuit devices and, more particularly, to an input stage that provides a more nearly optimal impedance match and constant gain, irrespective of whether a integrated circuit device is driven from a single-ended or from a differential input signal source.

BACKGROUND

Remarkable growth in the demand for communications products and services, and especially in the requirements for portable communications devices, has driven consumer requirements for low-cost, small-form-factor, low-power RF (radio frequency) transceivers. In addition, the development of state-of-the-art wireless applications has encouraged consumers to expect both the convenience of extended connectivity and the benefit of enhanced services. RF transceivers that operate in compliance with multiple prevailing standards are instrumental, if not required, in the satisfaction of these objectives. In this regard, the capabilities of CMOS (complementary metal/oxide/semiconductor) and BiCMOS (bipolar/CMOS) VLSI (very large scale integration) technology are particularly well suited to the accommodation of very aggressive levels of mixed-signal integration, as well as to the provision of increasing functionality in a single-chip RF integrated circuit (IC) device.

In general, the signal received by an RF transceiver IC from an antenna is typically a single-ended signal. However, the input IC (RF transceiver, for example) designed to process the signal from the antenna may be either single-ended or differential. Providing a differential input to the IC is desirable because any interfering signal that affects both of the differential inputs equally is cancelled. Unfortunately, converting a single-ended signal from the antenna into a differential signal for the IC requires a balanced-to-unbalanced converter (balun). Baluns tend to be expensive, introduce loss, and do not provide an ideally flat passband. Therefore, in many cases it is desirable to avoid the use of a balun and simply arrange the IC to receive the single-ended signal.

Typically an RF transceiver IC will be designed to accept either a single-ended input or differential input, but not both. It is difficult to handle both single-ended and differential inputs, in large part due to the disparate input impedance requirements for the single-ended and differential inputs.

For RF signals, the input impedance to the IC needs to match the source impedance of the signal source that provides the input. If the antenna drives the single-ended input to the IC directly, the input impedance of the IC must be equal to the source impedance ($R_s$) of the antenna. In situations where a balun is used to effect single-ended to differential conversion, the impedance present at each of the differential input pins of the IC must be equal to one-half the antenna source impedance, i.e., $R_s/2$.

SUMMARY OF THE INVENTION

The subject Differential/Single-Ended Input Stage is effective in providing the necessary interface between an input signal source and an integrated device (such as an integrated RF transceiver, for example), irrespective of whether the input signal source to the integrated device is single-ended or differential. That is, in accordance with one embodiment, the input stage may serve as a low-noise amplifier (LNA) that accepts either single-ended or differential inputs and provides a differential output. In particular, the input stage is designed to present the appropriate input impedance to both single-ended and differential signals, and to maintain substantially constant gain in doing so.

In one embodiment, a circuit controllably couples to either a single-ended or a differential signal source. First and second coupling networks respectively couple a signal to first and second active devices. The circuit comprises a control node to select between single-ended and differential operation.

In a further embodiment, an active gain stage is caused to operate in either a single-ended mode or in a differential mode by selectively coupling a capacitor to a control node.

In another embodiment, an input stage comprises an attenuator coupled between an input signal source and an active stage that accepts a differential input signal. The input stage comprises an attenuator to couple to the input signal source and an active stage coupled to an output of the attenuator. The active stage comprises first and second active devices. The attenuator comprises a control node to determine whether the input stage operates in a single-ended or in a differential mode.

In a still further embodiment, an integrated receiver system comprises an input stage to a low-noise amplifier (LNA). A mixer is coupled to the LNA. A demodulator is coupled to the mixer, and a baseband stage is coupled to the output of the demodulator. The input stage is operable to couple to a signal source and is controllable to operate with either a single-ended signal source or a differential signal source.

BRIEF DESCRIPTION OF THE DRAWINGS

The subject differential/single-ended input stage may be better understood by, and its many features, advantages and capabilities made apparent to, those skilled in the art with reference to the Drawings that are briefly described immediately below and attached hereto, in the several Figures of which identical reference numerals (if any) refer to identical or similar elements, and wherein.

Figure 1:
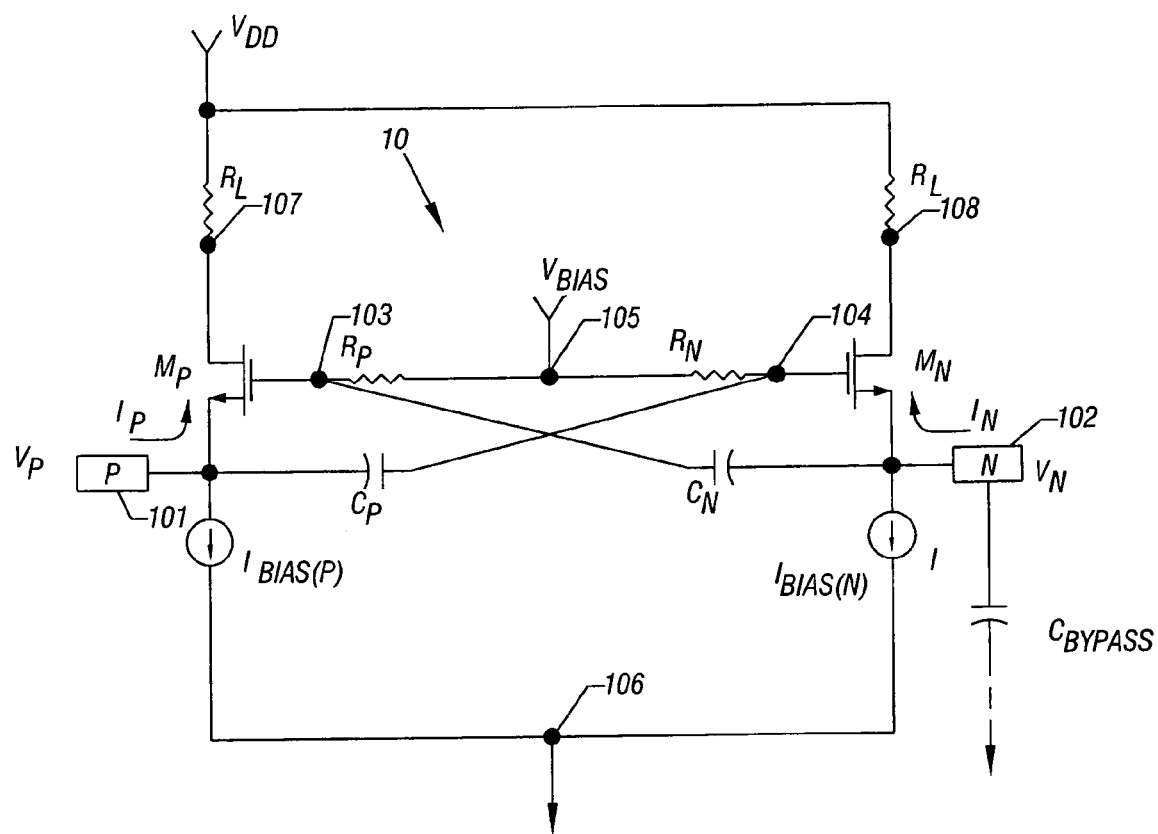
FIG. 1 is a circuit schematic of a differential/single-ended input stage in accordance with an embodiment of the invention.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION

For an understanding of the subject differential/single-ended input stage, reference may be had to the following Detailed Description, including the appended claims, in connection with the above-described Drawings.

The invention instantiates a technique to selectably control the input stage of an IC device for either single-ended or differential operation. That is, the device is operable to accept either a differential or single-ended input signal and provide a differential output signal to a succeeding stage. In one embodiment, selection is effected by the connection of a capacitor to an input terminal. Further, the input stage is designed so that the gain of the input stage remains constant with respect to single-ended or differential operation. Accordingly, embodiments are applicable to all forms of circuitry that suggest a need to convert, or accept, either single-ended or differential signals. In single-ended operation, the circuit provides substantially the same degree of immunity from low and high-frequency interfering signals as it does in differential operation.

FIG. 1 is a circuit schematic of an input stage 10 in accordance with embodiment of the invention. In a contemplated application, input stage 10 may be coupled between an input signal source, such as an antenna, for example, and other circuit stages, such as an LNA, for example, in an integrated transceiver. However, embodiments may be used in other situations that suggest a need for compatibility with both single-ended and differential signal sources.

Referring now to FIG. 1, depicted therein is an embodiment of input stage 10 that may selectively serve as either a differential or single-ended input stage. In one embodiment, input stage 10 may, for example, couple to an antenna and serve as the LNA input stage of an integrated receiver. (Note that although differential/single-ended input stage 10 is described here primarily in the context of a receiver system, the scope of the invention is not limited to this application. That is, embodiments are applicable to all forms of circuitry that suggest a need to controllably convert, or accept, both single-ended and differential signals.)

As may be seen in FIG. 1, input stage 10 comprises first active transconductance device in the form of MOSFET (metal-oxide-semiconductor field effect transistor) $M_p$. Input stage 10 also comprises second active transconductance device in the form of MOSFET $M_n$. $M_p$ has a source electrode coupled to input terminal 101. $M_n$ has a source electrode coupled to input terminal 102. The gate electrodes of $M_p$ and $M_n$ are coupled to resistors $R_p$ and $R_n$, respectively, at respective nodes 103 and 104. $R_p$ and $R_n$ are coupled, respectively, between the gate electrodes of $M_p$ and $M_n$ and circuit node 105. Circuit node 105 is coupled to a bias voltage, $V_{BIAS}$. A first capacitor, $C_p$, is coupled between terminal 101 and node 104. A second capacitor, Cn, is coupled between terminal 102 and node 103.

In a manner that is apparent from FIG. 1, the combination of $C_p$ and $R_N$ operates as a coupling network to couple $V_p$, the input voltage at terminal 101, to the gate of $M_N$. Similarly, $C_N$ and $R_p$ operate as a coupling network to couple $V_n$, the input voltage at terminal 102, to the gate of $M_p$.

The source electrode of $M_p$ is coupled at terminal 101 to a bias current source $I_{BIAS(P)}$, and from $I_{BIAS(P)}$ to node 106 (GND). The source electrode of $M_n$ is coupled at terminal 102 to a bias current source $I_{BIAS(N)}$, and from $I_{BIAS(N)}$ to GND. In one embodiment $I_{BIAS(P)}$ and $I_{BIAS(N)}$ establish substantially equal quiescent currents in $M_p$ and $M_n$, respectively. For reasons to be made clear below, the bias current sources are designed to establish quiescent currents in $M_p$ and $M_N$, respectively, in a manner that causes those devices to operate with a predetermined transconductance, Gm, for each of these devices.

The differential output of input stage 10 appears at the drain electrode of $M_p$, i.e., at node 107, and at the drain electrode of $M_n$, i.e., at node 108.

In an embodiment, input terminal 101 and input terminal 102 may represent respective conductive pads on an IC device. The pads may, in turn, be connected to pins, or terminals, on the device package. For purposes of simplicity, terminals 101 and 102 are intended to represent all, or any part of, the conductive path between the interface to an input signal source and the active devices, $M_p$ and $M_n$.

With continued reference to FIG. 1, it may be readily demonstrated that the impedance at terminal 101 is equal to $$\frac{V_p}{I_p},$$

where $V_p$ is the signal voltage at terminal 101, and $I_p$ is the signal current flowing into terminal 101. Similarly, it may be demonstrated that the impedance at terminal 102 is equal to $$\frac{V_n}{I_n},$$

where $V_n$ is the signal voltage at terminal 102 and $I_p$ is the signal current flowing into terminal 102.

The values of $R_p C_n$ and $R_n C_p$ are chosen so that $V_n$ appears on the gate of $M_p$ and $V_p$ appears on the gate on $M_n$ for all frequencies of interest.

For differential inputs, $V_n = -V_p$. Therefore the gate-to-source voltage of $M_p$ is $2V_p$. The current generated by $M_p$ is equal to the gate-to-source voltage multiplied by its transconductance. Therefore the input impedance at terminal 101 is equal to $$\frac{V_p}{I_p},$$

which is equal to $$\frac{V_p}{V_{GS_p} Gm_{mp}} = \frac{V_p}{2V_p Gm_{mp}} = \frac{1}{2Gm_p}.$$

Using a similar analysis:

$$\frac{V_n}{I_n} = \frac{1}{2}\frac{1}{Gm_n}.$$

If the transconductance $M_p$ is set equal to the transconductance of $M_n$ and equal to $$\frac{1}{R_s}, \text{then} \frac{1}{Gm_p} = \frac{1}{Gm_n} = R_s.$$

It follows then that the desired result for a differential input has been achieved and that the input impedance at each input pin, i.e., at terminals 101 and 102, is $$\frac{R_s}{2}.$$

Accordingly, insofar as has been described above, input stage 10 operates to suitably couple a differential input signal to a subsequent stage that also requires a differential signal.

In one embodiment, it may be necessary that input stage 10 couple a single-ended signal source to a differential input of a following circuit. When it is desired to operate input stage 10 in such a single-ended mode, then an appropriate capacitance, $C_{BYPASS}$, may be coupled from terminal 102 to GND. Skilled practitioners understand that $C_{BYPASS}$ will be selected to effectively present an impedance that, at operating frequencies of interest, approximates zero so far as reasonably practicable.

In one embodiment, $C_{BYPASS}$ may be a discrete capacitor that is selectively physically connected at terminal 102 by attachment to a pin, or terminal, on the IC device package. However, the invention is not limited in this regard. For example, $C_{BYPASS}$ may be included within the IC device itself, and may be selectively connected to terminal 102 by internal switching devices (not shown). What is significant is that circuit 10 accommodates the selective connection, however accomplished, of $C_{BYPASS}$ to terminal 102 (or an equivalent), in response to whether operation with a single-ended or differential signal source is required.

With $C_{BYPASS}$ connected at terminal 102, the gate of $M_p$ is effectively grounded at the signal frequency, and the signal voltage, $V_p$, is applied to the gate of $M_n$. It may be demonstrated that, under the above-stated conditions, the impedance at terminal 101 is given by $$\frac{V_p}{I_p} = \frac{V_p}{V_{GS_p} Gm_{mp}} = \frac{V_p}{V_p Gm_p} = \frac{1}{Gm_p}.$$

If, as before, $$\frac{1}{Gm_p} = \frac{1}{Gm_n} = R_s,$$

then the single-ended input impedance is the desired impedance, $R_s$.

From the above description, it is apparent that the input impedance at terminal 102 may be selected in accordance with the desired mode of operation (differential or single-ended) and provides impedances at terminals 101 and 102 that are appropriate to the selected mode. Specifically, when operating from a differential signal source, the input impedance at terminal 101 is equal to the impedance at terminal 102, ($R_s/2$). When operating from a single-ended source, the impedance at terminal 101 is $R_s$.

Furthermore, consistent with the above, terminal 102 may be viewed as a control terminal, or control node, in at least the sense that the mode of operation input stage 10 is determined by a prevailing condition at terminal 102. That is, when a bypass capacitor is coupled to terminal 102, the input stage operates in a single-ended mode. Otherwise, input stage 10 operates in a differential mode.

At very low frequencies, $C_{BYPASS}$ appears as an open circuit. Therefore, for single-ended inputs, input stage 10 appears substantially identical to the differential circuit and effects substantially the same degree of immunity to low-frequency interfering signals. At very high frequencies, the self-inductance of the bypass capacitor and the inductance of the bond wires at terminals 101 and 102 cause $C_{BYPASS}$ to be effectively isolated from terminal 102. Therefore, at very high frequencies, the input stage appears identical to the differential circuit and affords substantially the same degree of immunity to interfering signals.

In some embodiments, it may be desirable to insert an input attenuator prior to the input stage 10 shown in FIG. 1. Ideally, even in circumstances where such an attenuator is included, then it will likely be an objective to maintain the controllable and selectable single-ended and differential input characteristics described above. That is, the input impedance should remain $$\frac{R_s}{2}$$

for differential inputs and $R_s$ for single-ended inputs.

Figure 2:
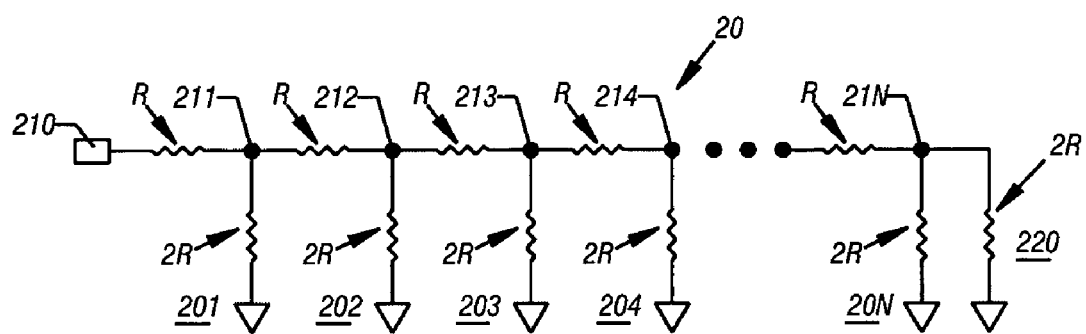
FIG. 2 is a circuit schematic of a conventional resistor ladder network.

In accordance with one embodiment, an "R-2R" resistive ladder attenuator may be included between the signal source and input stage 10. A R-2R attenuator is depicted in FIG. 2. The salient characteristics of the R-2R attenuator of FIG. 2 include: (i) an attenuation factor that is a function of the number of divider sections in the attenuator and (ii) a constant input impedance, irrespective of the number of divider sections, equal to 2R. As may be seen in FIG. 2, the R-2R attenuator depicted there comprises a number of divider sections 201, 202, 203, 204, . . . , 20N, for example. In one embodiment, each divider section comprises a first resistor having a value R coupled to a node (one of nodes 211, 212, 213, 214, . . . , 21N, for example). In each divider section, a second resistor having a value 2R is coupled from a respective divider section node to a common circuit node, e.g. GND. A terminating resistor branch 220, comprising a resistor having a value 2R, is coupled from the last divider section node (e.g., node 21N) to GND.

Figure 3:
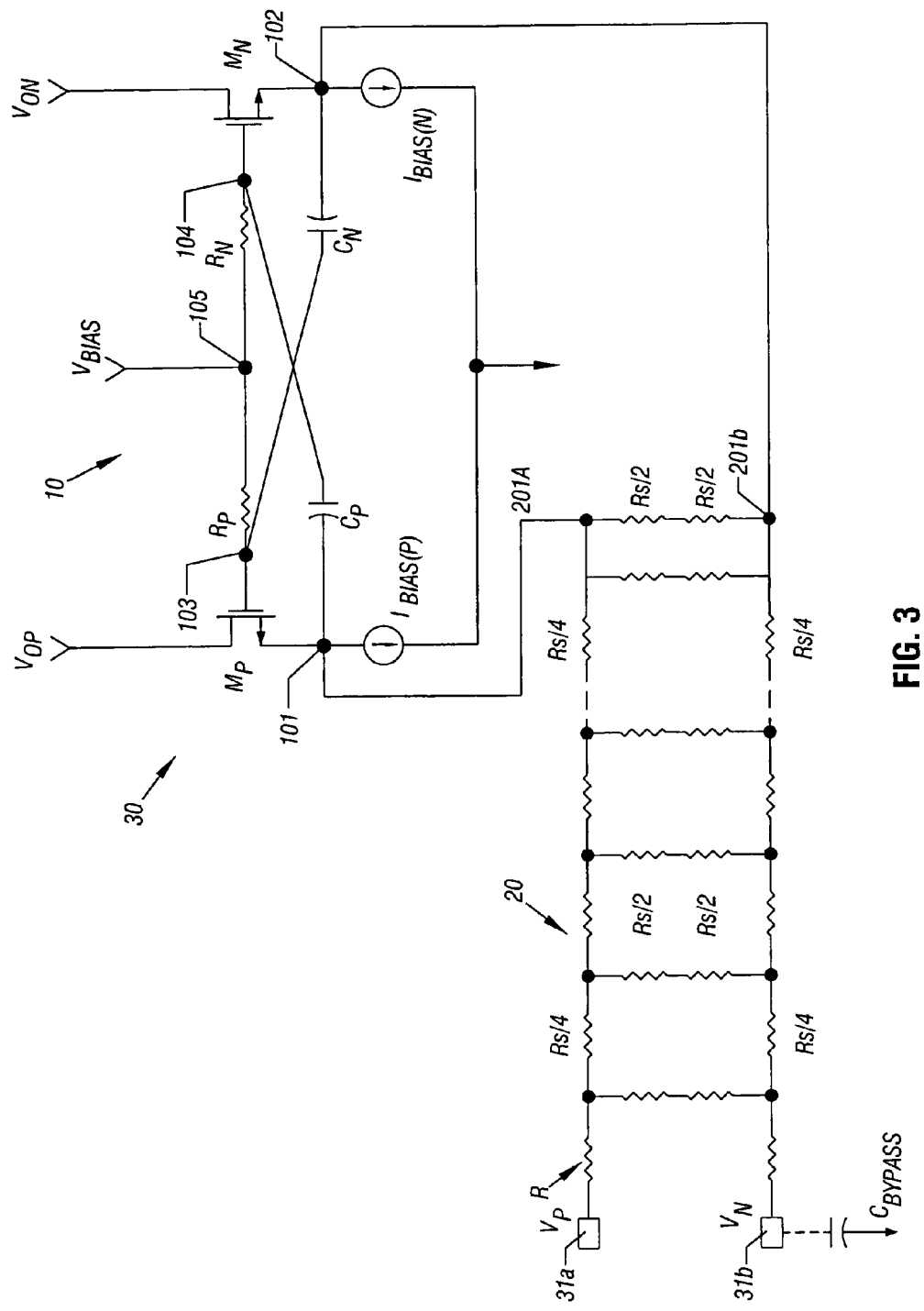
FIG. 3 is a circuit schematic of an input stage in accordance with an embodiment in which there is also provided attenuation of an input signal.

In one embodiment, an R-2R attenuator may be included with input stage 10, resulting in the circuit of FIG. 3. In the embodiment of FIG. 3, in order to select single-ended operation, $C_{BYPASS}$ is coupled from input terminal 31b, ($V_N$) to GND. Of course, $C_{BYPASS}$ is omitted in the differential mode of operation. In this sense, then, terminal 31b operates as a control node. In accordance with the embodiment of FIG. 3, input stage 30 comprises an attenuator 20 interposed between a signal source (not shown) and an active input stage 10. Input stage 30 comprises a first input terminal 31a and a second input terminal 31b. In practice, appropriate signals, $V_p$ and $V_N$, from the signal source are coupled to terminals 31a and 31b, respectively. In one embodiment, active stage 10 may be identical, or substantially similar, to input stage 10 depicted in FIG. 1.

As may be seen in FIG. 3, input stage 10 comprises first active transconductance device in the form of MOSFET $M_p$ and comprises second active transconductance device in the form of MOSFET $M_n$. $M_p$ has a source electrode coupled to input node 101. Mn has a source electrode coupled to input node 102. The gate electrodes of $M_p$ and $M_n$ are coupled to resistors $R_p$ and $R_n$, respectively, at respective nodes 103 and 104. $R_p$ and $R_n$ are coupled, respectively, between the gate electrodes of $M_p$ and $M_n$ and circuit node 105. Circuit node 105 is coupled to a bias voltage, $V_{BIAS}$. A first capacitor, $C_p$, is coupled between terminal 101 and node 104. A second capacitor, Cn, is coupled between terminal 102 and node 103.

Attenuator 20 is coupled at its input between input terminals 31a and 31b. The output of attenuator 20, at node 201a and node 201b, is coupled to nodes 101 and 102 of the active stage 10. In the input stage of FIG. 3, input terminal 31b serves as a control node to enable the input stage to operate selectably in either a single-ended mode or a differential mode. That is, when the control node (terminal 31b) is floated, input stage 30 is configured to operate compatibly with a differential signal source. Conversely, when $C_{BYPASS}$ is coupled to the control node, input stage 30 is configured to operate compatibly wit a single-ended signal source.

Figure 4:
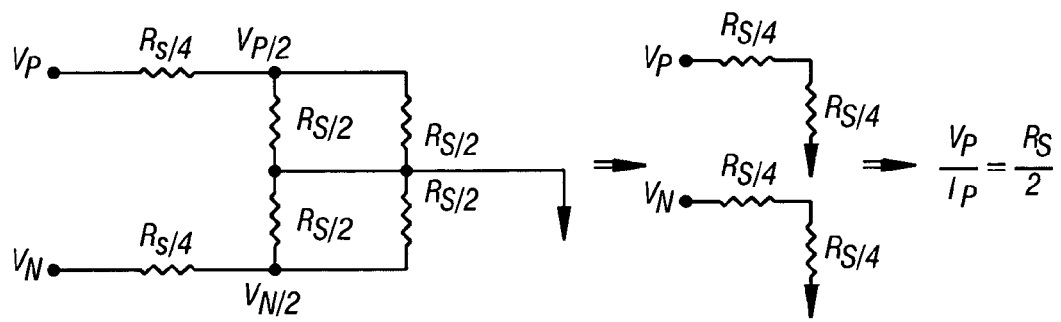
FIG. 4 is an equivalent circuit schematic of a resistive input attenuator with a differential input.

FIG. 4 represents an equivalent input stage that is applicable to a differential mode of operation, that is, when the input signal source delivers a differential signal. From FIG. 4 it may be concluded that with $R=R_s/4$ in the attenuator design, then the impedance presented at each terminals 31a (P) and 31b (N) is $R_s/2$, as is desired.

Figure 5:
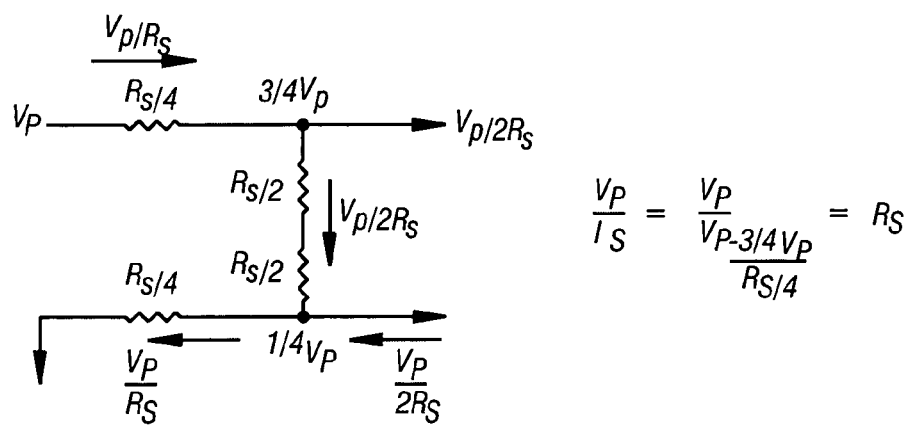
FIG. 5 is an equivalent circuit schematic of a resistive input attenuator with a single-ended input.

FIG. 5 represents an equivalent input stage that is applicable to a single-ended mode of operation, that is, when the input signal is single-ended. From FIG. 5 it may be concluded that with $R=R_s/4$ in the attenuator design, then the impedance presented at terminal 31a (P) is $R_s$, as desired.

The combined attenuator/(input stage) illustrated in FIG. 3 presents the appropriate input impedance to both differential and single-ended signal sources. In addition, by the simple device of adding additional divider sections, an arbitrary attenuation factor may be achieved. The attenuation factor is $(\frac{1}{2}^N)$, where N is the number of divider sections.

In some embodiments, it is a performance objective to realize an equivalent input stage gain, irrespective of differential or single-ended operation. The manner in which this objective may be achieved is understandable with reference to FIG. 3. Assume here that equal load resistances, $R_L$ (not shown in FIG. 3), are coupled to the drain electrodes of both $M_p$ and $M_N$. The output voltages are represented in FIG. 3 as $V_{OP}$ and $V_{ON}$, respectively.

The most straightforward way to comprehend the gain is to realize that all of the input current at the desired frequencies flows through the load resistors $R_L$. For differential inputs, the input signal appears across $V_p$ and $V_n$ (terminals 31a and 31b) with $$V_p = \frac{V_m}{2} \text{ and } V_n = -\frac{V_m}{2}.$$

The current in $R_L$ is $$\frac{\frac{V_{in}}{2}}{\frac{R_s}{2}} = \frac{V_{in}}{R_s}.$$

Therefore, the stage gain is $$\frac{V_{op}}{V_p} = \frac{R_L}{R_s}.$$

Similarly, for single-ended inputs $V_{in}=V_p$ and $V_n=0$. Then the current into $R_L$ is $$\frac{V_{in}}{R_s}$$

and the stage gain is $$\frac{V_{op}}{V_p} = \frac{R_L}{R_s}.$$

A similar analysis may be used to demonstrate that the gain for single-ended operation is identical to the differential gain, even when the resistor ladder attenuator used.

Accordingly there has been described above a versatile technique that enables an input stage for an integrated transceiver (for example) to operate seamlessly with either single-ended or differential signal sources. The desired result is achieved, in large part, by the efficient expedient of selectively coupling an appropriate capacitance to one of the input terminals to the integrated device. In one embodiment, an attenuator may be interposed between the signal source and the active devices in the input stage. Even with the embellishment, appropriate impedances are selectively presented to either single-ended or differential signal sources. In addition to providing appropriate input impedances and variable attenuation, the stage gain is identical in both the single-ended and differential mode of operation.

Figure 6:
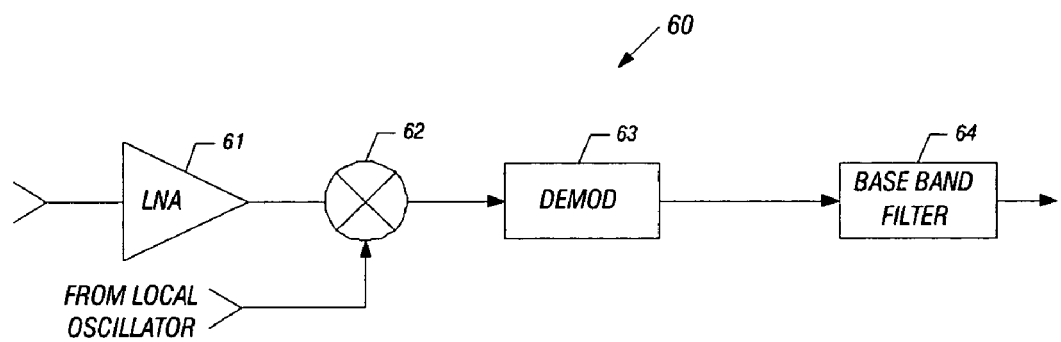
FIG. 6, is a circuit schematic of an input stage in accordance with an embodiment of the invention, wherein the input stage drives a balance load.

The subject differential/single-ended input stage is attractive in numerous applications. For example, the apparatus may be used with salutary effect in a receiving system such as depicted in FIG. 6. The receiving system of FIG. 6 is representative in its salient aspects of receiving systems that may be used in connection with DBS (direct broadcast satellite) communications equipment and may be included in the familiar set-top box for satellite television systems.

As illustrated in FIG. 6, receiving system 60 comprises a low-noise amplifier (LNA) 61 that serves as front end of the receiver. LNA 61 is, in operation, coupled to an appropriate antenna (not shown). The output of LNA 61 is frequency converted in a mixer 62. The frequency-converted output of mixer 62 is demodulated by demodulator 63. In many receiver system architectures, an IF (intermediate frequency) amplifier is interposed between mixer 62 and demodulator 63. The demodulated signal is coupled to a baseband filter 64, i.e., a low-pass filter with specified a cutoff frequency.

In an embodiment, LNA may preferably comprise an input stage to couple an input signal source (not shown). LNA 61 may assume the configuration as depicted in FIG. 1. Alternatively, under some conditions it may be desired that an attenuator be interposed between the LNA and the signal source. If so, LNA 30, depicted in FIG. 3, complete with an input attenuator, may be used. In either situation, inclusion of input stage (such as input stage 10 or input stage 30) enables operation to be controlled so as to accept either single-ended or differential input signals.

While the present invention has been described with respect to a limited number of embodiments, those skilled in the art will appreciate numerous modifications and variations therefrom. It is intended that the appended claims cover all such modifications and variations as fall within the true spirit and scope of this present invention.

Be aware that the invention has been described above as, in one embodiment, serving as a LNA for an integrated receiver. Alternatively, another embodiment may operate to couple an LNA to the input signal source.

What is claimed is:

1. A circuit to controllably couple to a single-ended or to a differential signal source, the circuit comprising:
   a first active device;
   a second active device;
   a first coupling network to couple a signal to the first active device;
   a second coupling network to couple a signal to the second active device; and
   a control node to selectively control the circuit for either single-ended or differential operation, wherein the control node is operable to couple a capacitance to the first coupling network if the single-ended signal source is coupled to the circuit.

2. A circuit as defined in claim 1, further comprising:
   a first input node to couple a first signal to the first coupling network; and
   a second input node to couple a second signal to the second coupling network, wherein the first signal and the second signal constitute opposite phases of a differential signal.

3. A circuit as defined in claim 2, wherein the first input node is operable to couple a capacitance to the first coupling network so as to effect single-ended operation of the circuit and to decouple the capacitance so as to effect differential operation of the circuit.

4. A circuit as defined in claim 3, wherein the capacitance is coupled between the first input node and a ground potential.

5. A circuit as defined in claim 4, wherein the capacitance presents a low impedance at an input signal frequency.

6. A circuit as defined in claim 3, further comprising:
   first means for establishing a transconductance of the first active device; and
   second means for establishing a transconductance of the second active device.

7. A circuit as defined in claim 6, wherein the first means and the second means comprise respectively, a first current source coupled to the first input node and a second current source coupled to the second input node.

8. A circuit as defined in claim 2, wherein an input impedance of the second input node is at a first value in the differential operation and at a second value in the single-ended operation.

9. A circuit as defined in claim 8, wherein the first value of the input impedance is less than the second value of the input impedance.

10. A method comprising:
    causing an active gain stage to operate in a single-ended mode by selectively coupling a capacitor to a control node of the active gain stage and to operate in a differential mode by selectively decoupling the capacitor from the control node.

11. The method as defined in claim 10, further comprising:
    presenting a substantially constant input impedance to a signal source, irrespective of whether the active gain stage is caused to operate in the single-ended mode or in the differential mode.

12. The method as defined in claim 11, further comprising:
    coupling a signal source to the active gain stage through an attenuator.

13. The method as defined in claim 12, wherein the active gain stage comprises:
    a first input node;
    a second input node;
    a first active device;
    a second active device;
    a first RC network coupled between the first input node and the first active device; and
    a second RC network coupled between the second input node and the second active device.

14. The method as defined in claim 13, wherein the active devices are transconductance devices.

15. The method as defined in claim 14, wherein the active devices are MOSFETs.

16. The method as defined in claim 14, further comprising:
    a first current source coupled to the first active device to establish a transconductance of the first active device; and
    a second current source coupled to the second active device to establish a transconductance of the second active device.

17. An input stage comprising:
    a first active device having an input node, an output node, and a control node;
    a second active device having an input node, an output node and a control node;
    a circuit node to couple to a bias source;
    a first resistance coupled between the circuit node and the control node of the first active device;
    a second resistance coupled between the circuit node and the control node of the second active device;
    a first capacitance coupled between the input node of the first active device and the control node of the second active device; and
    a second capacitance coupled between the input node of the second active device and the control node of the first active device; and
    means coupled to the input node of the second active device for selectively establishing single-ended operation or differential operation of the input stage based on a type of signal source coupled to the input stage.

18. An input stage as defined in claim 17, wherein the means for establishing single-ended operation comprises a capacitor.

19. An input stage as defined in claim 18, wherein the capacitor is coupled between the input node of the second active device and signal ground.

20. An input stage as defined in claim 17, wherein the first active device is a transconductance device and the second active device is a transconductance device.

21. An input stage as defined in claim 20, wherein the first active device is a MOSFET and the second active device is a MOSFET.

22. An input stage as defined in claim 20, further comprising:
a first current source coupled to the first transconductance device to establish an operating transconductance of the first transconductance device; and
a second current source coupled to second transconductance device to establish an operating transconductance of the second transconductance device.

23. An input stage as defined in claim 22, wherein the first current source and the second current source are configured so that the operating transconductance of the first transconductance device is substantially equal to the operating transconductance of the second transconductance device.

24. An input stage as defined in claim 23, wherein the operating transconductances are set to generate a predetermined input impedance presented by the input stage.

25. An input stage as defined in claim 24, wherein the input impedance presented by the input stage is substantially equal to a predetermined source impedance.

26. An input stage as defined in claim 25, wherein the input impedance is at the same value in the single-ended operation and the differential operation.

27. An input stage as defined in claim 17, wherein a gain of the input stage is at the same value in the single-ended operation and the differential operation.

28. An input stage comprising:
a first input terminal;
a second input terminal;
an attenuator coupled to the first input terminal and to the second input terminal, the attenuator having a first output node and a second output node; and
an active stage comprising:
a first active device having an input node and an output node;
a second active device having an input node and an output node;
a circuit node to couple to a bias source;
a first resistance coupled between the circuit node and the input node of the first active device;
a second resistance coupled between the circuit node and the input node of the second active device;
a first capacitance coupled between the input node of the second active device and the first output node of the attenuator;
a second capacitance coupled between the input node of the first active device and the second output node of the attenuator; and
a control node coupled to the attenuator to enable the input stage to operate selectably in either a single-ended mode or a differential mode.

29. An input stage as defined in claim 28, wherein the input stage is operable in a single-ended mode or in a differential mode in accordance with a component coupled to the control node.

30. An input stage as defined in claim 29, wherein the input stage is operable in the single-ended mode in response to the coupling of the component to the control node, the component to effect a low impedance at a predetermined frequency of operation.

31. An input stage as defined in claim 30, wherein the component comprises a capacitor.

32. An input stage as defined in claim 29, wherein the first active device is a transconductance device and the second active device is a transconductance device.

33. An input stage as defined in claim 32, wherein the first active device is a MOSFET and the second active device is a MOSFET.

34. An input stage as defined in claim 32, further comprising:
a first current source coupled to the first transconductance device to establish an operating transconductance of the first device; and
a second current source coupled to second transconductance device to establish an operating transconductance of the second transconductance device.

35. An input stage as defined in claim 34, wherein the first current source and the second current source are configured so that the operating transconductance of the first transconductance device is substantially equal to the operating transconductance of the second transconductance device.

36. An input stage as defined in claim 35, wherein the operating transconductances are set to generate a predetermined input impedance presented by the input stage.

37. An input stage as defined in claim 36, wherein the input impedance presented by the input stage is substantially equal to a predetermined source impedance.

38. An input stage as defined in claim 29, wherein the attenuator comprises a resistor ladder network.

39. An input stage as defined in claim 38, wherein the resistor ladder network comprises an R/2R ladder network.

40. An input stage as defined in claim 38, further comprising:
means coupled to the control node for effecting the single-ended mode.

41. An input stage as defined in claim 40, wherein the means for effecting the single-ended mode comprises a capacitor.

42. An input stage as defined in claim 41, wherein the capacitor is coupled between the control node and a signal ground.

43. An integrated circuit comprising:
an input stage to receive an incoming signal, wherein the incoming signal is a differential input signal or a single-ended input signal, the input stage including:
a first transistor to receive a first input voltage of the incoming signal; and
a second transistor to receive a second input voltage of the incoming signal, wherein the input stage is to present an input impedance of an equal value regardless of whether the incoming signal is the differential input signal or the single-ended input signal; a capacitance to be selectively coupled to a first terminal of the first transistor if the incoming signal is the single-ended input signal.

44. The integrated circuit defined in claim 43, further comprising an attenuator network coupled to receive the input signal and provide an attenuated input signal to the input stage.

45. The integrated circuit defined in claim 43, wherein the capacitance is to ground a gate terminal of the second transistor if the incoming signal is the single-ended input signal.

* * * * *